United States Patent
Yu et al.

(10) Patent No.: US 11,816,352 B2
(45) Date of Patent: Nov. 14, 2023

(54) ELECTRONIC DEVICE, DATA STROBE GATE SIGNAL GENERATOR CIRCUIT AND DATA STROBE GATE SIGNAL GENERATING METHOD

(71) Applicant: Realtek Semiconductor Corporation, Hsinchu (TW)

(72) Inventors: Chun-Chi Yu, Hsinchu (TW); Chih-Wei Chang, Hsinchu (TW); Gerchih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 159 days.

(21) Appl. No.: 17/507,864

(22) Filed: Oct. 22, 2021

(65) Prior Publication Data

US 2023/0126654 A1   Apr. 27, 2023

(51) Int. Cl.
| | |
|---|---|
| G06F 3/06 | (2006.01) |
| G06F 1/06 | (2006.01) |
| G11C 11/4076 | (2006.01) |
| H03K 19/00 | (2006.01) |
| H03K 19/20 | (2006.01) |

(52) U.S. Cl.
CPC ............. *G06F 3/0655* (2013.01); *G06F 1/06* (2013.01); *G06F 3/0604* (2013.01); *G06F 3/0673* (2013.01); *G11C 11/4076* (2013.01); *H03K 19/0005* (2013.01); *H03K 19/20* (2013.01)

(58) Field of Classification Search
CPC ...... G06F 3/0655; G06F 1/06; G11C 11/4076
See application file for complete search history.

(56) References Cited

U.S. PATENT DOCUMENTS

| | | | | |
|---|---|---|---|---|
| 7,733,715 | B2* | 6/2010 | Park | G11C 7/1051 |
| | | | | 365/230.03 |
| 8,429,438 | B2* | 4/2013 | Espinoza | G11C 7/1051 |
| | | | | 713/401 |
| 8,819,354 | B2* | 8/2014 | Seto | G06F 13/4239 |
| | | | | 711/154 |
| 2008/0144406 | A1* | 6/2008 | Park | G11C 7/1066 |
| | | | | 365/233.1 |

* cited by examiner

*Primary Examiner* — David E Martinez
(74) *Attorney, Agent, or Firm* — McClure, Qualey & Rodack, LLP (57) ABSTRACT

A processor circuit sends a read request. A clock signal of the processor circuit corresponds to a first counting value. A memory circuit stores data and sends a data strobe signal in response to the read request. The data strobe signal corresponds to a second counting value. The processor circuit includes a selector circuit and a feedback circuit. The selector circuit selects and outputs a flag signal from a plurality of flag control signals according to the second counting value. The feedback circuit generates an enable signal according to a set signal associated with the first counting value, the flag signal associated with the second counting value, and a data strobe gate signal, and generates the data strobe gate signal according to the enable signal and the data strobe signal. The processor circuit reads the data according to the data strobe gate signal.

20 Claims, 4 Drawing Sheets

ELECTRONIC DEVICE, DATA STROBE GATE SIGNAL GENERATOR CIRCUIT AND DATA STROBE GATE SIGNAL GENERATING METHOD

BACKGROUND

Technical Field

The present disclosure relates to memory technology, more particularly, an electronic device, a data strobe gate signal generator circuit, and a data strobe gate signal generating method.

Description of Related Art

With development of memory technology, reading/writing speed of the memory keeps increasing. In some related arts, when a processor sends a read request to a memory, the memory returns a data strobe signal to the processor. Then, the processor extracts the data strobe signal according to its clock signal for the subsequent reading operation. However, since the clock signal of the processor and the data strobe signal from the memory belong to different clock domains, the clock signal of the processor and the data strobe signal are asynchronous. This may cause incorrect data reading.

SUMMARY

Some aspects of the present disclosure are to provide an electronic device. The electronic device includes a processor and a memory circuit. The processor circuit is configured to send a read request. A clock signal of the processor circuit corresponds to a first counting value. The memory circuit is configured to store data and sends a data strobe signal in response to the read request. The data strobe signal corresponds to a second counting value. The processor circuit includes a data strobe gate signal generator circuit. The data strobe gate signal generator circuit includes a selector circuit and a feedback circuit. The selector circuit is configured to select and output a flag signal from a plurality of flag control signals according to the second counting value. The feedback circuit is configured to generate an enable signal according to a set signal associated with the first counting value, the flag signal associated with the second counting value, and a data strobe gate signal, and generates the data strobe gate signal according to the enable signal and the data strobe signal. The processor circuit is further configured to read the data according to the data strobe gate signal.

Some aspects of the present disclosure are to provide a data strobe gate signal generator circuit. The data strobe gate signal generator circuit is disposed in a processor circuit. A clock signal of the processor circuit corresponds to a first counting value. The data strobe gate signal generator circuit includes a selector circuit and a feedback circuit. The selector circuit is configured to select and output a flag signal from a plurality of flag control signals according to a second counting value corresponding to a data strobe signal. The feedback circuit is configured to generate an enable signal according to a set signal associated with the first counting value, the flag signal associated with the second counting value, and a data strobe gate signal, and generate the data strobe gate signal according to the enable signal and the data strobe signal. The processor circuit is further configured to read data from a memory circuit according to the data strobe gate signal.

Some aspects of the present disclosure are to provide a data strobe gate signal generating method. The data strobe gate signal generating method includes following operations: selecting and outputting, by a selector circuit in a processor circuit, a flag signal from a plurality of flag control signals according to a data strobe signal, in which a clock signal of the processor circuit corresponds to a first counting value, and the data strobe signal corresponds to a second counting value; generating, by a feedback circuit in the processor circuit, an enable signal according to a set signal associated with the first counting value, the flag signal associated with the second counting value, and a data strobe gate signal; and generating, by the feedback circuit, the data strobe gate signal according to the enable signal and the data strobe signal.

As described above, the present disclosure utilizes the counting value of the clock signal of the processor circuit and the counting value of the data strobe signal from the memory circuit to control the enable signal, such that the data strobe signal can be extracted completely by the enable signal to generate an accurate data strobe gate signal. Thus, the processor circuit can utilize the data strobe gate signal to read the data from the memory circuit more accurately.

BRIEF DESCRIPTION OF THE DRAWINGS

The disclosure can be more fully understood by reading the following detailed description of the embodiment, with reference made to the accompanying drawings as follows.

DETAILED DESCRIPTION

In the present disclosure, "connected" or "coupled" may refer to "electrically connected" or "electrically coupled." "Connected" or "coupled" may also refer to operations or actions between two or more elements.

Figure 1:
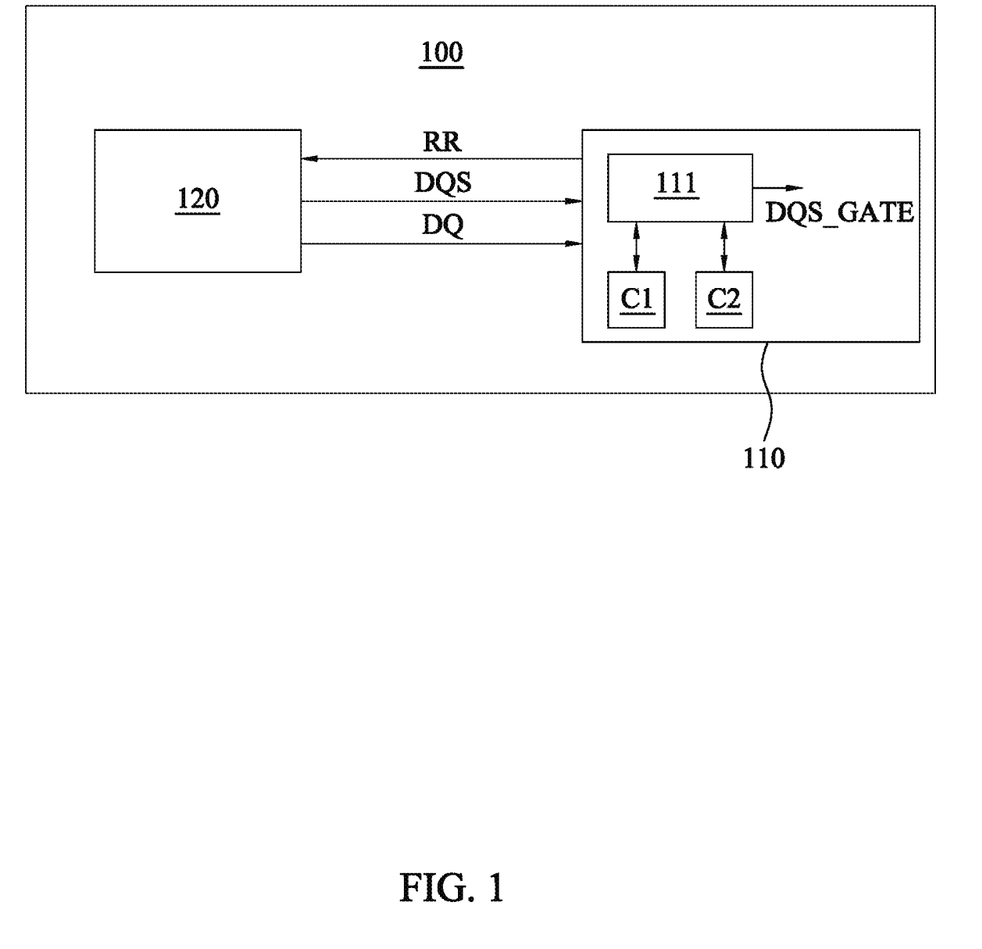
FIG. 1 is a schematic diagram illustrating an electronic device according to some embodiments of the present disclosure.

Reference is made to FIG. 1. FIG. 1 is a schematic diagram illustrating an electronic device 100 according to some embodiments of the present disclosure. The electronic device 100 is, for example, a tablet computer, a laptop computer, a display device, or other electronic devices, but the present disclosure is not limited thereto.

As illustrated in FIG. 1, the electronic device 100 includes a processor circuit 110 and a memory circuit 120. The processor circuit 110 is coupled to the memory circuit 120.

The processor circuit 110 can be but not limited to, for example, a central processor unit, other circuits, or other SoC which can process signals in specific designed ways. The memory circuit 120 can be but not limited to, for example, a double data rate synchronous dynamic random access memory (DDR SDRAM) or other circuits which can store data.

The memory circuit 120 can store a plurality of data DQ. The processor circuit 110 can send a read request RR to the memory circuit 120 to request for reading the data DQ in the memory circuit 120. When the memory circuit 120 receives the read request RR, the memory circuit 120 can return a data strobe signal DQS to the processor circuit 110 in response to the read request RR. A data strobe gate signal generator circuit 111 of the processor circuit 110 can generate a data strobe gate signal DQS_GATE according to the received data strobe signal DQS. Then, the processor circuit 110 can read the data DQ in the memory circuit 120 according to the data strobe gate signal DQS_GATE.

The following paragraphs take the read request RR corresponding to N (e.g., N=4) working cycles (as the working cycles CYC in FIG. 3) as an example (but not limited thereto). In other words, in such example, one working period includes N (e.g., N=4) working cycles CYC.

Figure 2:
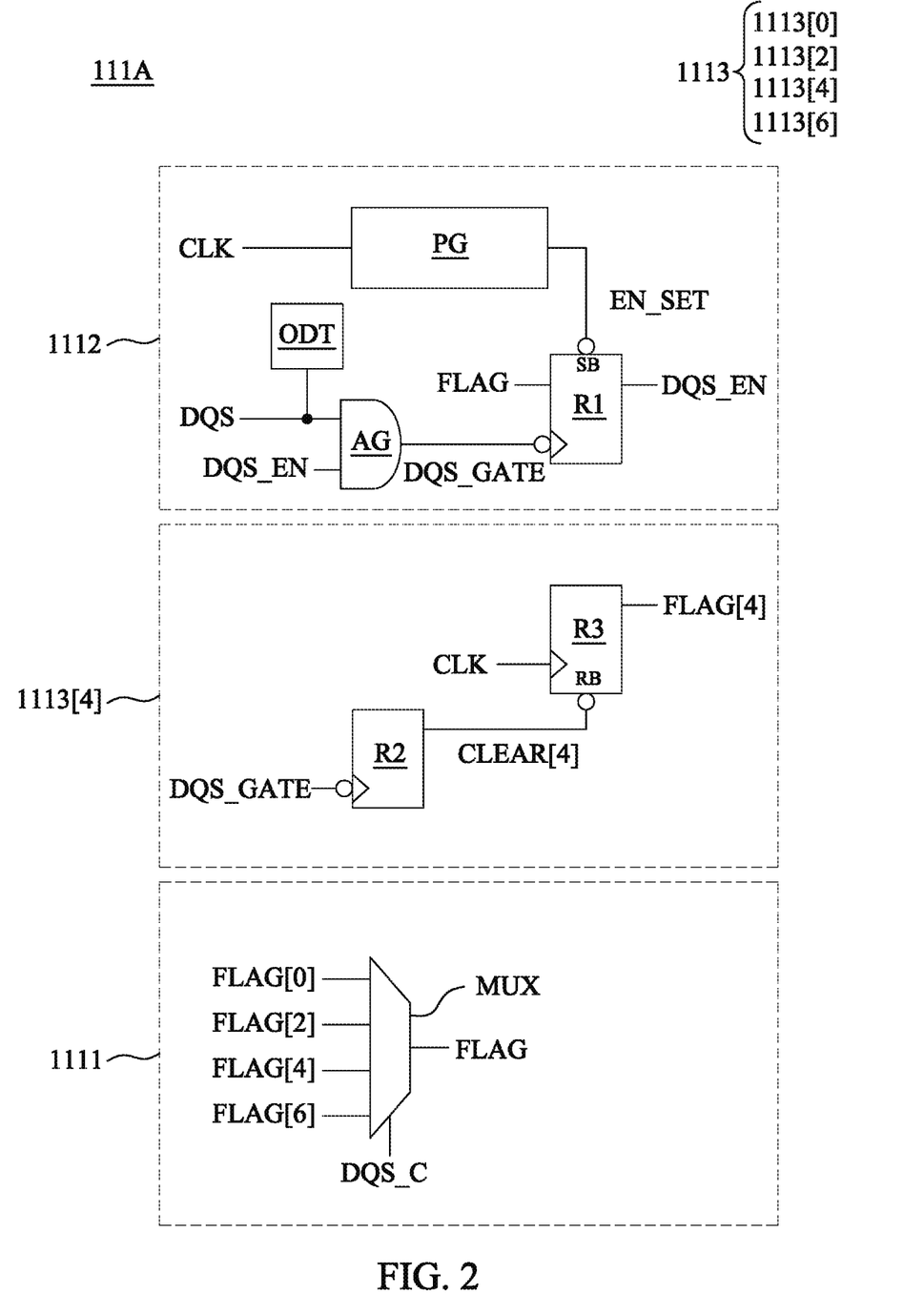
FIG. 2 is a schematic diagram illustrating a data strobe gate signal generator circuit according to some embodiments of the present disclosure.

Reference is made to FIG. 2. FIG. 2 is a schematic diagram illustrating a data strobe gate signal generator circuit 111A according to some embodiments of the present disclosure. In some embodiments, the data strobe gate signal generator circuit 111 in FIG. 1 is implemented by the data strobe gate signal generator circuit 111A in FIG. 2.

As illustrated in FIG. 2, the data strobe gate signal generator circuit 111A includes a selector circuit 1111, a feedback circuit 1112, and a control circuit 1113, in which the control circuit 1113 include N (e.g., N=4) sub-control circuits 1113[0], 1113[2], 1113[4], 1113[6].

The selector circuit 1111 outputs a flag signal FLAG selected from flag control signals FLAG[0], FLAG[2], FLAG[4], FLAG[6] according to a counting value DQS_C of the data strobe signal DQS.

As illustrated in FIG. 2, the selector circuit 1111 can include a multiplexer MUX. Input terminals of the multiplexer MUX receive the flag control signals FLAG[0], FLAG[2], FLAG[4], FLAG[6] respectively, the multiplexer MUX is controlled by the counting value DQS_C of the data strobe signal DQS, and an output terminal of the multiplexer MUX is configured to output one of flag control signals to be the flag signal FLAG. For example, when the counting value DQS_C is 0, the multiplexer MUX outputs the flag control signal FLAG[0] to be the flag signal FLAG. When the counting value DQS_C is 2, the multiplexer MUX outputs the flag control signal FLAG[2] to be the flag signal FLAG. In a similar manner, the multiplexer MUX outputs the flag control signals FLAG[4] and FLAG[6] when the counting value DQS_C are 4 and 6, respectively.

The feedback circuit 1112 generates an enable signal DQS_EN according to a set signal EN_SET, the flag signal FLAG, and the data strobe gate signal DQS_GATE, in which the data strobe gate signal DQS_GATE is determined according to the enable signal DQS_EN and the data strobe signal DQS.

As illustrated in FIG. 2, the feedback circuit 1112 can include a pulse generator PG, a register R1, and an AND gate AG. The pulse generator PG can generate the set signal EN_SET according to a clock signal CLK of the processor circuit 110. A set port SB of the register R1 can receive the set signal EN_SET, a data port of the register R1 can receive the flag signal FLAG, and a trigger port of the register R1 can receive the data strobe gate signal DQS_GATE. The register R1 is triggered by falling edges of the data strobe gate signal DQS_GATE. The register R1 can output the enable signal DQS_EN at its output port according to the set signal EN_SET, the flag signal FLAG and the data strobe gate signal DQS_GATE. The AND gate AG can generate the data strobe gate signal DQS_GATE according to the data strobe signal DQS and the enable signal DQS_EN.

The control circuit 1113 generates the flag control signals FLAG[0], FLAG[2], FLAG[4], FLAG[6] according to the data strobe gate signal DQS_GATE and the clock signal CLK.

As illustrated in FIG. 2, the control circuit 1113 includes sub-control circuits 1113[0], 1113[2], 1113[4], and 1113[6]. For better understanding, FIG. 2 merely illustrates one sub-control circuit 1113[4]. The sub-control circuit 1113[4] can include a register R2 and a register R3. A trigger port of the register R2 can receive the data strobe gate signal DQS_GATE and the register R2 is triggered by falling edges of the data strobe gate signal DQS_GATE. The register R2 can generate a corresponding clear signal CLEAR[4] at its output port according to the data strobe gate signal DQS_GATE. A reset port RB of the register R3 can receive the corresponding clear signal CLEAR[4], a trigger port of the register R3 can receive the clock signal CLK, and the register R3 is triggered by rising edges of the clock signal CLK. The register R3 can output the corresponding flag control signal FLAG[4] at its output port according to the clock signal CLK and the corresponding clear signal CLEAR[4].

Figure 3:
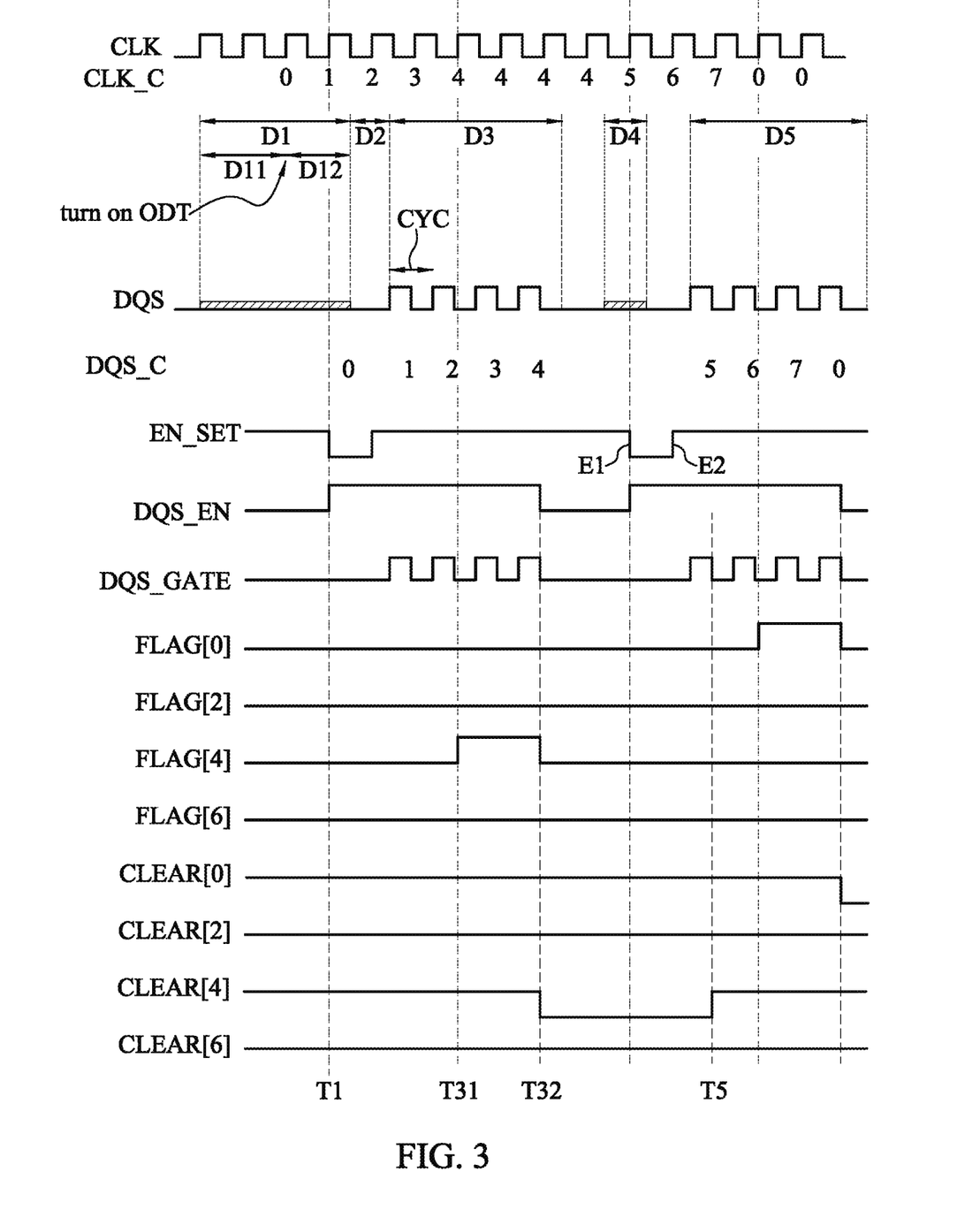
FIG. 3 is a schematic diagram illustrating waveforms of a plurality of signals in FIG. 2 according to some embodiments of the present disclosure.

Similarly, other sub-control circuits 1113[0], 1113[2] and 1113[6] have similar circuit structures to generate a clear signal CLEAR[0] and the flag control signal FLAG[0], a clear signal CLEAR[2] and the flag control signal FLAG[2], a clear signal CLEAR[6] and the flag control signal FLAG[6] in FIG. 3 respectively.

FIG. 3 is a schematic diagram illustrating waveforms of a plurality of signals in FIG. 2 according to some embodiments of the present disclosure.

The following paragraphs are described with reference to FIGS. 1-3.

At first, the clock signal CLK in FIG. 3 is a clock signal of the processor circuit 110 in FIG. 1. In some embodiments, the processor circuit 110 in FIG. 1 further includes a counter C1, and the counter C1 can be configured to count the clock signal CLK to generate a counting value CLK_C. For example, the counter C1 can count rising edges of the clock signal CLK. The "rising edges" hereafter indicates a transition from a relatively low logic value 0 to a relatively high logic value 1. In some embodiments, the processor circuit 110 in FIG. 1 can further includes a counter C2, and the counter C2 can be configured to count the data strobe signal DQS to generate the counting value DQS_C. For example, the counter C2 can count falling edges of the data strobe signal DQS. The "falling edges" hereafter indicates a transition from a relatively high logic value 1 to a relatively low logic value 0. Since the clock signal CLK of the processor circuit 110 and the data strobe signal DQS from the memory circuit 120 belong to different clock domains, the clock signal CLK and the data strobe signal DQS are asynchronous and there is a phase difference between the clock signal CLK and the data strobe signal DQS, as shown in FIG. 3.

As illustrated in FIG. 3, an output timeline of the data strobe signal DQS can be separated into three sequential intervals, which are an idle time interval D1, a preamble time interval D2, and a working time interval D3. In other words, the idle time interval D1 is prior to the preamble time interval D2, and the preamble time interval D2 is prior to the working time interval D3.

Regarding the idle time interval D1 (an idle time interval D4 is similar to the idle time interval D1), in general, the data strobe signal DQS a bidirectional signal. For example, when the processor circuit 110 tries to read the data DQ from the memory circuit 120, the memory circuit 120 sends the data strobe signal DQS to the processor circuit 110, as shown in FIG. 1. On the contrary, when the processor circuit 110 writes the data DQ into the memory circuit 120, the processor circuit 110 sends the data strobe signal DQS to the memory circuit 120. However, when the processor circuit 110 is not reading or writing the data DQ, this corresponds to the idle time interval D1 of the data strobe signal DQS. In other words, in the idle time interval D1, there is only noise (illustrated with slash filled blocks in the figure) and no effective data strobe signal DQS. In FIG. 3, the counter C1 can start counting the clock signal CLK in the idle time interval D1.

The preamble time interval D2 is a period of time before the effective data strobe signal DQS is outputted. In some embodiments, a length of the preamble time interval D2 can be equal to a working cycle CYC to inform the processor circuit 110 in advance that the effective data strobe signal DQS (the pulses in the working time interval D3) can be transmitted from the memory circuit 120.

Regarding the working time interval D3, as described above, if the read request RR outputted from the processor circuit 110 corresponds to N (e.g., N=4) working cycles CYC, there are N (e.g., N=4) pulses in the working time interval D3. In an example of the memory circuit 120 being the DDR SDRAM, since data are transmitted not only at rising edges but also at falling edges, the working time interval D3 includes 2N (e.g., 8) data.

In operation, the pulse generator PG can generate the set signal EN_SET according to the clock signal CLK of the processor circuit 110.

The following paragraphs describe a rising edge of the enable signal DQS_EN.

As illustrated in FIG. 3, the idle time interval D1 includes a time interval D11 and a time interval D12. As shown in FIG. 2, the AND gate AG of the processor circuit 110 includes an input terminal for receiving the data strobe signal DQS, and an on-die termination circuit ODT can be coupled to the input terminal. In some embodiments, the on-die termination circuit ODT can include a switch and a termination resistor (not shown), and the switch is coupled between the input terminal and the termination resistor. When the switch is turned on, the turned-on switch can couple the input terminal and the termination resistor. It represents that the on-die termination circuit ODT is turned on and the time interval D12 is entered. This termination resistor can make an impedance from the memory circuit 120 (i.e., transmitter) to a transmission line (the transmission line is between the memory circuit 120 and the processor circuit 110) match an impedance from the transmission line to the processor circuit 110 (i.e., receiver), in order to avoid the signal from the memory circuit 120 to the processor circuit 110 being reflected back. In addition, this termination resistor can make the data strobe signal DQS in the time interval D12 be pulled to a relatively low logic value 0 to cancel noise in the time interval D12. Since the noise in the time interval D12 is cancelled, a falling edge of the set signal EN_SET can be designed in the time interval D12 earlier (noise can affect the generation of the set signal EN_SET). Since noises occur in the time interval D11, the time interval D11 is called as a tri-state time interval. Since noises are cancelled in the time interval D12, the time interval D12 is considered a noise-cancelled time interval.

In some other embodiments, the on-die termination circuit ODT can be turned on in the preamble time interval D2, such that the falling edge of the set signal EN_SET can be designed in the preamble time interval D2 earlier.

At a time point T1, when the counting value CLK_C corresponds to 1, the set signal EN_SET shows a falling edge. Since the set port SB of the register R1 has a higher priority, the enable signal DQS_EN is pulled to a relatively high logic value 1 in response to the set signal EN_SET received at the set port SB. In other words, a rising edge of the enable signal DQS_EN can be in the time interval D12 in response to the falling edge of the set signal EN_SET. In other words, the falling edge of the set signal EN_SET and the rising edge of the enable signal DQS_EN are shown after the on-die termination circuit ODT is turned on. Then, after a short period of time, the set signal EN_SET is changed from a relatively low logic value 0 to a relatively high logic value 1.

The following paragraphs describe a falling edge of the enable signal DQS_EN.

At a time point T31, when the counting value CLK_C of the clock signal CLK is N (e.g., N=4), the corresponding flag control signal FLAG[4] shows a rising edge. At a time point T32, when the counting value DQS_C of the data strobe signal DQS is N (e.g., N=4), the corresponding flag control signal FLAG[4] shows a falling edge. In other words, the rising edge of the corresponding flag control signal FLAG[4] corresponds to the counting value CLK_C of the clock signal CLK, and the falling edge of the corresponding flag control signal FLAG[4] corresponds to the counting value DQS_C of the data strobe signal DQS. Explained in another way, the rising edge and the falling edge of the corresponding flag control signal FLAG[4] correspond to two different clocks (the clock signal CLK of the processor circuit 110 and the clock of the data strobe signal DQS from the memory circuit 120) respectively. The two different clocks are asynchronous and there is a phase difference between the two different clocks.

In addition, at the time point T32, since the counting value DQS_C of the data strobe signal DQS is 4, the multiplexer MUX outputs the corresponding flag control signal FLAG[4] to be the flag signal FLAG according to the counting value DQS_C. In other words, the corresponding flag control signal FLAG[4] is transmitted to the register R1 to be the flag signal FLAG. At this time, since the set signal EN_SET with the higher priority is kept at a relatively high logic value 1, the enable signal DQS_EN outputted by the register R1 shows a falling edge in response to both of the falling edge of the flag signal FLAG (the corresponding flag control signal FLAG[4]) and the falling edge of the data strobe gate signal DQS_GATE.

Based on the paragraphs above, the rising edge of enable signal DQS_EN corresponds to the counting value CLK_C. The falling edge of the enable signal DQS_EN corresponds to the counting value DQS_C. In other words, the rising edge and the falling edge of the enable signal DQS_EN correspond to the counting values of two different clocks (the clock signal CLK of the processor circuit 110 and the clock of the data strobe signal DQS from the memory circuit 120) respectively. The two different clocks are asynchronous and there is a phase difference between the two different clocks.

Then, the AND gate AG can perform an AND calculation on the data strobe signal DQS and the enable signal DQS_EN to generate the data strobe gate signal DQS_GATE. As shown in FIG. 3, since the first rising edge of the enable signal DQS_EN occurs in the idle time interval D1 and the first falling edge of the enable signal DQS_EN is aligned to a last falling edge of the data strobe signal DQS in the working time interval D3, the data strobe signal DQS can be fully extracted by the high-state enable signal DQS_EN (e.g., a relatively high logic value 1) to generate an accurate data strobe gate signal DQS_GATE. Then, the processor circuit 110 can read the data DQ in the memory circuit 120 more accurately according to the data strobe gate signal DQS_GATE.

An approach to generate the corresponding flag control signal FLAG[4] is described in detail in following paragraphs.

As described above, if the read request RR sent from the processor circuit 110 corresponds to N (e.g., N=4) working cycles CYC, the sub-control circuit 1113[4] is activated.

At the time point T31, when the counting value CLK_C of the clock signal CLK is N (e.g., N=4), the corresponding flag control signal FLAG[4] outputted from the register R3 shows a rising edge in response to the rising edge of the clock signal CLK.

At the time point T32, the data strobe gate signal DQS_GATE shows a falling edge. In response to the falling edge of the data strobe gate signal DQS_GATE, the corresponding clear signal CLEAR[4] outputted from the register R2 shows a falling edge. Then, in response to the falling edge of the corresponding clear signal CLEAR[4], the corresponding flag control signal FLAG[4] outputted from the register R3 shows a falling edge.

At a time point T5, when the counting value DQS_C is N+1 (e.g., N=5), the data strobe gate signal DQS_GATE shows another falling edge. In response to the falling edge of the data strobe gate signal DQS_GATE, the corresponding clear signal CLEAR[4] outputted from the register R2 shows a rising edge.

As described above, since the counter C1 counts the clock signal CLK in the earlier idle time interval D1 and the counter C2 counts the data strobe signal DQS in the later working time interval D3, the time point when the counting value CLK_C is 4 (e.g., the time point T31) is prior to the time point when the counting value DQS_C is 4 (e.g., the time point T32). Accordingly, the corresponding flag control signal FLAG[4] can be pulled to a relatively high logic value 1 at the earlier time point T31 and ready to control the falling edge of the enable signal DQS_EN at the time point T32 so as to prevent meta-stable problem.

In general, the memory circuit 120 has a read latency. In other words, if the memory circuit 120 receives the read request RR, the memory circuit 120 can send the data strobe signal DQS to the processor circuit 110 after a read delay time (e.g., 14 working cycles) based on its own clock.

Based on the aforementioned reasons, in some related arts, if the processor sends the read request, the processor circuit extracts the data strobe signal for subsequent reading operations after the read delay time (e.g., 14 working cycles) based on its own clock. However, as described above, the clock of the processor circuit and the clock of the memory circuit belong to different clock domains (they are asynchronous). In other words, the time point after the read delay time based on the clock of the processor circuit is different from the time point after the read delay time based on the clock of the memory circuit. In addition, the clock of the processor circuit and the clock of the memory circuit are varied due to temperature and voltage. Accordingly, utilizing the clock of the processor circuit to extract the data strobe signal from the memory circuit can cause the data strobe signal to be distorted, such that the processor circuit reads the data in the memory circuit inaccurately.

Compared to the aforementioned related arts, the present disclosure utilizes the counting value CLK_C of the clock signal CLK of the processor circuit 110 and the counting value DQS_C of the data strobe signal DQS from the memory circuit 120 to accurately control the rising edge and the falling edge of the enable signal DQS_EN, such that the rising edge of the enable signal DQS_EN is in the idle time interval D1 earlier and the falling edge of the enable signal DQS_EN corresponds to the last falling edge of the data strobe signal DQS in the working time interval D3. Accordingly, the enable signal DQS_EN can be utilized to extract the data strobe signal DQS completely to generate an accurate data strobe gate signal DQS_GATE. Then, the processor circuit 110 can utilize the data strobe gate signal DQS_GATE to read the data from the memory circuit 120 accurately.

In some embodiments, when a next working time interval D5 and the working time interval D3 are very close on the timeline, a next falling edge E1 of the set signal EN_SET can occur in the working time interval D3. Under this condition, the set signal EN_SET at the set port SB with higher priority can be designed to have a relatively low logic value 0 when the counting value DQS_C is 4 (e.g., extend the time interval between the falling edge E1 and the rising edge E2 to cover the last falling edge of the data strobe gate signal DQS_GATE in the working time interval D3), such that the enable signal DQS_EN is not pulled down and is kept at a relatively high logic value 1. Accordingly, the range of the enable signal DQS_EN can be extended.

Further, it is assumed that a length of the time interval between the falling edge E1 and the rising edge E2 (with a relatively low logic value 0) of the set signal EN_SET is one working cycle CYC. Under a condition that the falling edge E1 occurs in the working time interval D3, if the falling edge E1 is after the third falling edge (the counting value DQS_C is 3) in the working time interval D3, the rising edge E2 will occur after the fourth falling edge (the counting value DQS_C is 4) in the working time interval D3. Accordingly, it can ensure that the set signal EN_SET has a relatively low logic value 0 when the counting value DQS_C is 4, such that the enable signal DQS_EN is not pulled down and kept at the relatively high logic value 1 when the counting value DQS_C is 4. Accordingly, the range of the enable signal DQS_EN can be extended.

In some situations, the processor circuit 110 can fail to receive effective data strobe signal DQS or the received data strobe signal DQS is incomplete due to some factors. If the on-die termination circuit ODT is tuned off after the time interval D12, noises can occur in the working time interval D3 (tri-state). The noises in the working time interval D3 can be utilized as a compensation of the counting value DQS_C of the counter C2. In other words, the counter C2 in FIG. 1 can possibly count these noises. When the counting value DQS_C is 4, the enable signal DQS_EN can be pulled to a relatively low logic value 0 based on the aforementioned operations to finish this working period and to restore normal operation in a next working period (e.g., the enable signal DQS_EN can be pulled up to a relatively low logic value 1 by a falling edge of the set signal EN_SET in the next working period). If the on-die termination circuit ODT is not turned off, there is no noise in the working time interval D3 that can be used as compensation of the counting value DQS_C of the counter C2. The counter C2 can count the data strobe signal DQS in the next working time interval D5. When the counting value DQS_C is 4, the enable signal DQS_EN can be pulled to a relatively low logic value 0 based on the aforementioned operations to finish this working period and to restore normal operation in a next working period. In other words, the present disclosure has the auto repair mechanism.

Figure 4:
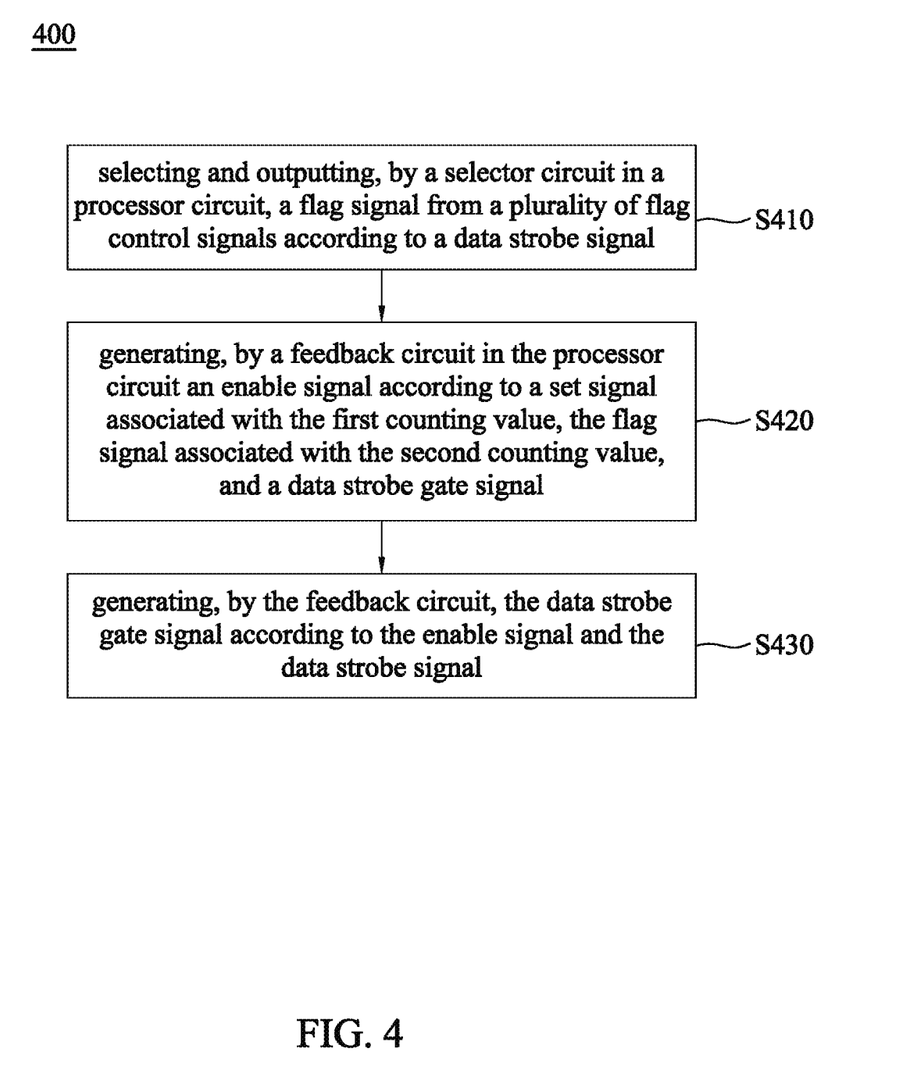
FIG. 4 is a flow diagram illustrating a data strobe gate signal generating method according to some embodiments of the present disclosure.

Reference is made to FIG. 4. FIG. 4 is a flow diagram illustrating a data strobe gate signal generating method 400 according to some embodiments of the present disclosure. As illustrated in FIG. 4, the data strobe gate signal generating method 400 includes operations S410, S420, and S430.

In some embodiments, the data strobe gate signal generating method 400 can be implemented to the data strobe gate signal generator circuit 111A in FIG. 2, but the present disclosure is not limited thereto. For better understanding, the following paragraphs are described with reference to the data strobe gate signal generator circuit 111A in FIG. 2.

In operation S410, the selector circuit 1111 of the processor circuit 110 selects and outputs the flag signal FLAG from the flag control signals FLAG[0], FLAG[2], FLAG[4], FLAG[6] according to the data strobe signal DQS. For example, the selector circuit 1111 can be implemented by the multiplexer MUX, and output one of the flag control signals FLAG[0], FLAG[2], FLAG[4], FLAG[6]to be the flag signal FLAG according to the counting value DQS_C of the data strobe signal DQS.

In operation S420, the feedback circuit 1112 in the processor circuit 110 generates the enable signal DQS_EN according to the set signal EN_SET associated with the counting value CLK_C, the flag signal FLAG associated with the counting value DQS_C, and the data strobe gate signal DQS_GATE. For example, the feedback circuit 1112 can include the register R1 to perform the operations above, in which the set signal EN_SET associated with the counting value CLK_C is configured to determine the rising edge of the enable signal DQS_EN, and the flag signal FLAG associated with the counting value DQS_C and the data strobe gate signal DQS_GATE are configured to determine the falling edge of the enable signal DQS_EN.

In operation S430, the feedback circuit 1112 generates the data strobe gate signal DQS_GATE according to the enable signal DQS_EN and the data strobe signal DQS. In some embodiments, the feedback circuit 1112 can include the AND gate AG to perform the AND calculation on the enable signal DQS_EN and the data strobe signal DQS to generate the data strobe gate signal DQS_GATE.

As described above, the present disclosure utilizes the counting value of the clock signal of the processor circuit and the counting value of the data strobe signal from the memory circuit to control the enable signal, such that the data strobe signal can be extracted completely by the enable signal to generate the accurate data strobe gate signal. Thus, the processor circuit can utilize the data strobe gate signal to read the data from the memory circuit more accurately.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device comprising:
   a processor circuit configured to send a read request, wherein a clock signal of the processor circuit corresponds to a first counting value; and
   a memory circuit configured to store data and send a data strobe signal in response to the read request, wherein the data strobe signal corresponds to a second counting value,
   wherein the processor circuit comprises:
      a data strobe gate signal generator circuit comprising:
      a selector circuit configured to select and output a flag signal from a plurality of flag control signals according to the second counting value; and
      a feedback circuit configured to generate an enable signal according to a set signal associated with the first counting value, the flag signal associated with the second counting value, and a data strobe gate signal, and generate the data strobe gate signal according to the enable signal and the data strobe signal,
   wherein the processor circuit is further configured to read the data according to the data strobe gate signal.

2. The electronic device of claim 1, further comprising:
   a first counter configured to count the clock signal to generate the first counting value; and
   a second counter configured to count the data strobe signal to generate the second counting value.

3. The electronic device of claim 2, wherein a timeline of the data strobe signal corresponds to an idle time interval, a preamble time interval, and a working time interval sequentially,
   wherein the first counter starts to count the clock signal in the idle time interval.

4. The electronic device of claim 3, wherein the feedback circuit comprises:
   a pulse generator configured to generate the set signal according to the clock signal, wherein a falling edge of the set signal is in the idle time interval;
   a first register configured to generate the enable signal according to the set signal, the flag signal, and the data strobe gate signal; and
   an AND gate configured to generate the data strobe gate signal according to the data strobe signal and the enable signal.

5. The electronic device of claim 4, wherein in response to the falling edge of the set signal, a rising edge of the enable signal is in the idle time interval.

6. The electronic device of claim 5, wherein the feedback circuit comprises:
   an on-die termination circuit coupled to an input terminal configured to receive the data strobe signal, wherein the falling edge of the set signal and the rising edge of the enable signal occur after the on-die termination circuit is turned on.

7. The electronic device of claim 4, wherein under a condition that the working time interval comprises N working cycles, when the second counting value is N, the data strobe gate signal comprises a falling edge and the flag signal comprises a falling edge,
   wherein in response to the falling edge of the data strobe gate signal and the falling edge of the flag signal, the enable signal comprises a falling edge.

8. The electronic device of claim 4, wherein the data strobe gate signal generator circuit further comprises:
   a control circuit comprising a plurality of sub-control circuits, wherein when the working time interval comprises N working cycles, a sub-control circuit corresponding to N of the sub-control circuits is activated, wherein the activated sub-control circuit comprises:
   a second register configured to generate a corresponding clear signal according to the data strobe gate signal; and
   a third register configured to generate a corresponding flag control signal according to the clock signal and the corresponding clear signal, wherein the selector circuit outputs the corresponding flag control signal to be the flag signal.

9. The electronic device of claim 8, wherein when the second counting value is N, the data strobe gate signal comprises a first falling edge, wherein in response to the first falling edge of the data strobe gate signal, the corresponding clear signal comprises a falling edge,
wherein when the second counting value is (N+1), the data strobe gate signal comprises a second falling edge, wherein in response to the second falling edge of the data strobe gate signal, the corresponding clear signal comprises a rising edge.

10. The electronic device of claim 9, wherein when the first counting value is N, the clock signal comprises a rising edge, wherein in response to the rising edge of the clock signal, the corresponding flag control signal comprises a rising edge,
wherein in response to the falling edge of the corresponding clear signal, the corresponding flag control signal comprises a falling edge.

11. A data strobe gate signal generator circuit disposed in a processor circuit, wherein a clock signal of the processor circuit corresponds to a first counting value, wherein the data strobe gate signal generator circuit comprises:
a selector circuit configured to select and output a flag signal from a plurality of flag control signals according to a second counting value corresponding to a data strobe signal; and
a feedback circuit configured to generate an enable signal according to a set signal associated with the first counting value, the flag signal associated with the second counting value, and a data strobe gate signal, and generate the data strobe gate signal according to the enable signal and the data strobe signal,
wherein the processor circuit is configured to read data from a memory circuit according to the data strobe gate signal.

12. The data strobe gate signal generator circuit of claim 11, wherein a timeline of the data strobe signal corresponds to an idle time interval, a preamble time interval, and a working time interval sequentially,
wherein the feedback circuit comprises:
a pulse generator configured to generate the set signal according to the clock signal, wherein a falling edge of the set signal is in the idle time interval;
a first register configured to generate the enable signal according to the set signal, the flag signal, and the data strobe gate signal; and
an AND gate configured to generate the data strobe gate signal according to the data strobe signal and the enable signal.

13. The data strobe gate signal generator circuit of claim 12, wherein in response to the falling edge of the set signal, a rising edge of the enable signal is in the idle time interval.

14. The data strobe gate signal generator circuit of claim 13, wherein the feedback circuit comprises:
an on-die termination circuit coupled to an input terminal configured to receive the data strobe signal, wherein the falling edge of the set signal and the rising edge of the enable signal occur after the on-die termination circuit is turned on.

15. The data strobe gate signal generator circuit of claim 12, wherein under a condition that the working time interval comprises N working cycles, when the second counting value is N, the data strobe gate signal comprises a falling edge and the flag signal comprises a falling edge,
wherein in response to the falling edge of the data strobe gate signal and the falling edge of the flag signal, the enable signal comprises a falling edge.

16. The data strobe gate signal generator circuit of claim 12, wherein the data strobe gate signal generator circuit further comprises:
a control circuit comprising a plurality of sub-control circuits, wherein when the working time interval comprises N working cycles, a sub-control circuit corresponding to N of the sub-control circuits is activated, wherein the activated sub-control circuit comprises:
a second register configured to generate a corresponding clear signal according to the data strobe gate signal; and
a third register configured to generate a corresponding flag control signal according to the clock signal and the corresponding clear signal,
wherein the selector circuit outputs the corresponding flag control signal to be the flag signal.

17. The data strobe gate signal generator circuit of claim 16, wherein when the second counting value is N, the data strobe gate signal comprises a first falling edge, wherein in response to the first falling edge of the data strobe gate signal, the corresponding clear signal comprises a falling edge,
wherein when the second counting value is (N+1), the data strobe gate signal comprises a second falling edge, wherein in response to the second falling edge of the data strobe gate signal, the corresponding clear signal comprises a rising edge.

18. The data strobe gate signal generator circuit of claim 17, wherein when the first counting value is N, the clock signal comprises a rising edge, wherein in response to the rising edge of the clock signal, the corresponding flag control signal comprises a rising edge,
wherein in response to the falling edge of the corresponding clear signal, the corresponding flag control signal comprises a falling edge.

19. A data strobe gate signal generating method comprising:
selecting and outputting, by a selector circuit in a processor circuit, a flag signal from a plurality of flag control signals according to a data strobe signal, wherein a clock signal of the processor circuit corresponds to a first counting value, and the data strobe signal corresponds to a second counting value;
generating, by a feedback circuit in the processor circuit, an enable signal according to a set signal associated with the first counting value, the flag signal associated with the second counting value, and a data strobe gate signal; and
generating, by the feedback circuit, the data strobe gate signal according to the enable signal and the data strobe signal.

20. The data strobe gate signal generating method of claim 19, further comprising:
counting, by a first counter, the clock signal to generate the first counting value; and
counting, by a second counter, the data strobe signal to generate the second counting value.

* * * * *